United States Patent [19]
Forrest et al.

[11] Patent Number: 5,315,129
[45] Date of Patent: May 24, 1994

[54] ORGANIC OPTOELECTRONIC DEVICES AND METHODS

[75] Inventors: Stephen R. Forrest; Franky F. So, both of Torrance, Calif.

[73] Assignee: University of Southern California, Los Angeles, Calif.

[21] Appl. No.: 694,108

[22] Filed: May 1, 1991

Related U.S. Application Data

[63] Continuation-in-part of Ser. No. 570,279, Aug. 20, 1990, abandoned.

[51] Int. Cl.$^5$ .......................................... H01L 29/28
[52] U.S. Cl. ...................................... 257/21; 257/40; 257/184
[58] Field of Search ............... 357/8; 257/40, 21, 184, 257/431, 565

[56] References Cited

U.S. PATENT DOCUMENTS

| | | | |
|---|---|---|---|
| 4,164,431 | 8/1979 | Tang | 357/8 |
| 4,525,687 | 6/1985 | Chemla et al. | 257/189 |
| 4,749,850 | 6/1988 | Chemla et al. | 257/236 |
| 5,010,382 | 4/1991 | Katoh | 257/15 |

OTHER PUBLICATIONS

F. F. So et al., "Quasi-Epitaxial Growth of Organic Multiple Quantum Well Structures by Organic Molecular Beam Deposition", in *Applied Physics Letters*, vol. 56, No. 7, pp. 674–676 (Feb. 12, 1990).

Turek, P., et al., "A New Series of Molecular Semiconductors . . . ," J. Am. Chem. Soc., 1987, 109, pp. 5119–5122.

*Primary Examiner*—Sara W. Crane
*Attorney, Agent, or Firm*—Benman & Collins

[57] ABSTRACT

Organic optoelectronic devices, such as a modulator (54) and a photodetector (73) comprising alternating layers (58) of two crystalline planar organic aromatic semiconductors (60 and 62), have been grown by organic molecular beam deposition. These organic substances have been deposited in ultra-thin layers only 10 Å in depth using organic molecular beam deposition methods. Due to the anisotropic character of these organic materials,, the devices formed using these methods possess unique electronic and optical properties. The preferred embodiment of the invention utilizes 3,4,9,10-perylenetetracarboxylic dianhydride (PTCDA) and 3,4,7,8-naphthalenetetracarboxylic dianhydride (NTCDA). While the inventors have identified PTCDA and NTCDA as excellent materials for the manufacture of organic optoelectronic IC devices, the broad scope of the present invention encompasses the use of any planar organic aromatic semiconductor which readily forms a crystalline structure. The preferred method of the invention employs a chamber (23) containing an inorganic substrate (32) with appropriate material for making electrical contact to the organic structures and sources of PTCDA (36) and NTCDA (38). The chamber (23) is maintained at a pressure which is generally less than $10^{-6}$ Torr. The substrate (32) is separated from the source materials by a minimum separation distance of 10 cm. The substrate (32) is held below 150K while the PTCDA and NTCDA are alternately heated. The methods described above may also be employed to fabricate an organic phototransistor/photodetector (78).

35 Claims, 6 Drawing Sheets

PTCDA 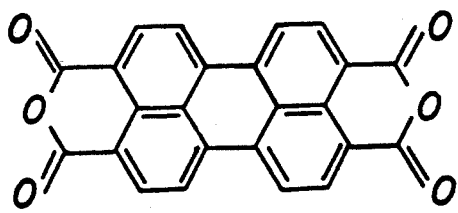
FIG. 1
NTCDA 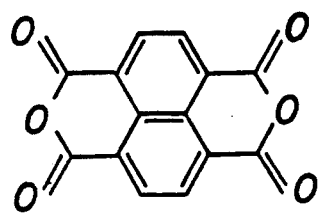
FIG. 2
FIG. 4A
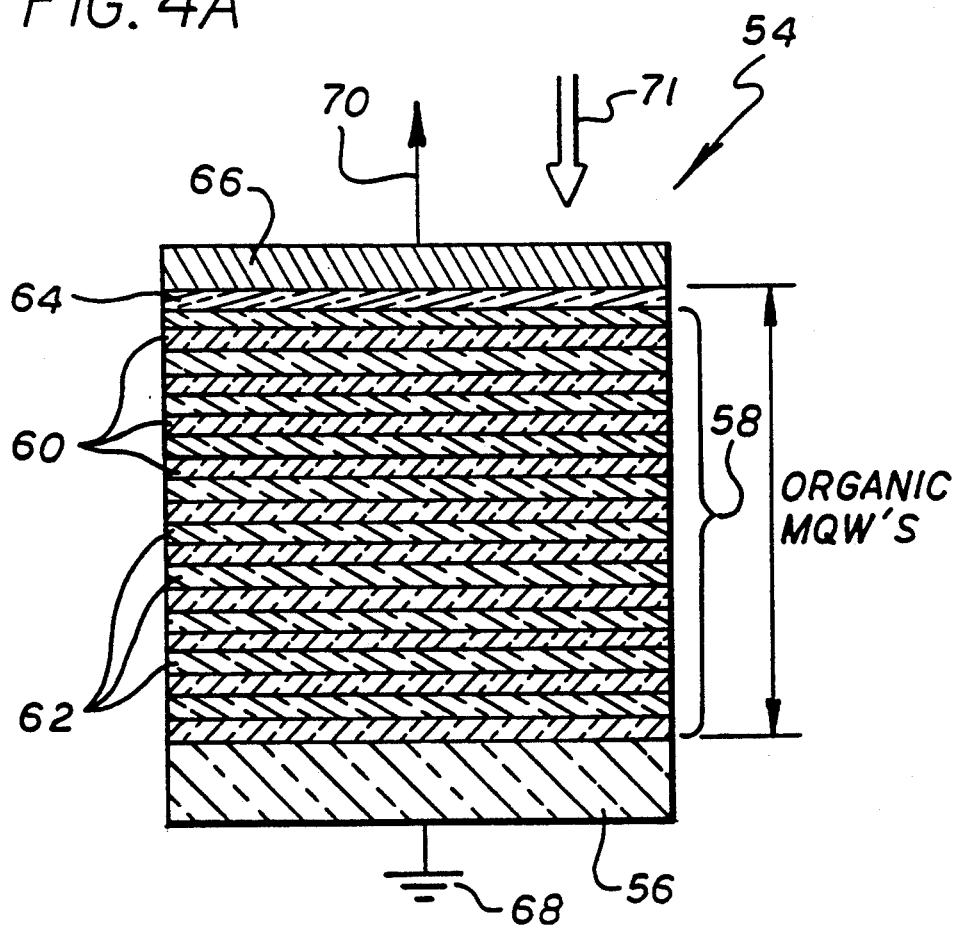

CuPc

PTCBI

ORGANIC OPTOELECTRONIC DEVICES AND METHODS

CROSS-REFERENCE TO RELATED APPLICATION

The present application is a continuation-in-part application of Ser. No. 07/570,279, filed Aug. 20, 1990, now abandoned.

TECHNICAL FIELD

The present invention includes methods for fabricating a wide variety of novel optoelectronic devices grown by innovative organic molecular beam quasi-epitaxial deposition processes. These manufacturing techniques may be employed to produce novel integrated circuit devices including multiple quantum well light modulators and photodetectors, phototransistors, and lasers.

BACKGROUND ART

Each year the electronics industry develops new techniques for fabricating integrated circuits (IC). The great majority of semiconductor devices currently in use employ silicon, germanium, gallium arsenide, or other similar inorganic materials. Many new IC designs utilize extremely thin alternating layers of semiconductor material that measure only a few atoms or molecules in depth. The physical integrity of these "ultra-thin" strata depends upon the physical and chemical forces which hold together the crystalline structure of these materials. When atoms in these crystals are not properly aligned with their neighbors, the resulting "lattice mismatch" can produce mechanical strains that can create dislocations within the crystal. These defects can impair the ability of a crystalline layer to conduct electrons and holes, and so can destroy the usefulness of the semiconductor device in which it resides.

In recent years, many researchers have investigated the use of organic materials to manufacture integrated circuits. In contrast to inorganic materials, organic crystalline materials are held together by relatively weak van der Waals forces. This phenomenon binds the atoms and molecules in the organic crystal in a less rigid, and hence in a more forgiving, fashion than is the case in inorganic structures. As a consequence, organic crystals are less susceptible to the failures caused by mechanical strains that can be built in to the crystal during their fabrication.

One of greatest challenges confronting scientists and engineers in the integrated circuit industry is the development of organic crystalline materials that are suitable for the mass production of integrated circuits. Devices constructed from these organic materials would be highly valuable due to the unique optoelectronic properties offered by many organic substances. The perfection of fabrication methods for these organic integrated circuits would constitute a major technological advance in the IC business. The enhanced performance that could be achieved using these methods would satisfy a long felt need within the semiconductor industry.

DISCLOSURE OF INVENTION

The organic optoelectronic devices and methods disclosed and claimed in this patent application overcome several problems encountered in making optoelectronic integrated circuit devices from conventional inorganic semiconductor materials. The inventors have fabricated novel semiconductor devices consisting of alternating layers of 3,4,9,10-perylenetetracarboxylic dianhydride (PTCDA) and 3,4,7,8-naphthalenetetracarboxylic dianhydride (NTCDA). These organic substances have been deposited in ultra-thin layers only 10 Å thick using organic molecular beam deposition methods. Due to the nature of molecular stacking in these crystalline organic semiconductors, PTCDA and NTCDA are highly anisotropic compared with inorganic semiconductors" resulting in unique electronic and optical properties. In the preferred embodiment of the invention, a chamber containing an inorganic semiconductor substrate and sources of PTCDA and NTCDA, or other suitable organic materials, are maintained at a pressure which is generally less than $10^6$ Torr. The substrate is separated from the source materials by a minimum separation distance of about 10 cm. The substrate is held below 150K while the PTCDA and NTCDA are alternately heated. The preferred method of the invention employs a maximum deposition rate of about 5 Å per second and a maximum layer depth of about 1 $\mu$M. While the inventors have identified PTCDA and NTCDA as excellent materials for the manufacture of organic optoelectronic IC devices, the broad scope of the present invention encompasses the use of any planar organic aromatic semiconductor which readily forms a crystalline structure.

The invention also includes an organic bipolar transistor/phototransistor comprising a multi-layer structure deposited in thin-film form. This device employs two stable, crystalline, aromatic dye compounds. one of the two compounds conducts holes, while the other conducts electrons. In the preferred embodiment of the invention, the compound which transports electrons is oxadiazole derivative (PBD), available from Dojindo Laboratories Co. Ltd., Kumamoto, Japan. The compound selected to transport holes is a phthalocyanine or a polyacene, examples of which include: copper phthalocyanine (CuPc), 3,4,9,10-perylenetetracarboxylic dianhydride (PTCDA), 3,4,7,8-naphthalenetetracarboxylic dianhydride (NTCDA), or 3,4,9,10-perylenetetracarboxylic-bis-benzimidazole (PB), or other naphthalene- and perylene-based compounds, including diimide and dimethyl derivatives of PTCDA and NTCDA.

The present invention includes novel methods and devices that address the troublesome lattice-mismatch and consequent mechanical strains that plague conventional inorganic semiconductor structures. These innovative processes and devices provide effective and efficient tools that will enable manufacturers of integrated circuit devices to create high quality products that will enhance the performance and capabilities of wide variety of optoelectronic devices.

An appreciation of other aims and objectives of the present invention and a more complete and comprehensive understanding of this invention may be achieved by studying the following description of a preferred embodiment and by referring to the accompanying drawings.

BRIEF DESCRIPTION OF THE DRAWINGS

FIG. 1 presents the molecular structural formula for 3,4,9,10-perylenetetracarboxylic dianhydride (PTCDA);

FIG. 2 presents the molecular structural formula for 3,4,7,8-naphthalenetetracarboxylic dianhydride (NTCDA);

FIG. 4A is a schematic view of an organic multiple quantum well light modulator;

BEST MODES FOR CARRYING OUT THE INVENTION

Fabrication of Organic Crystalline Semiconductor Structures

Figure 3:
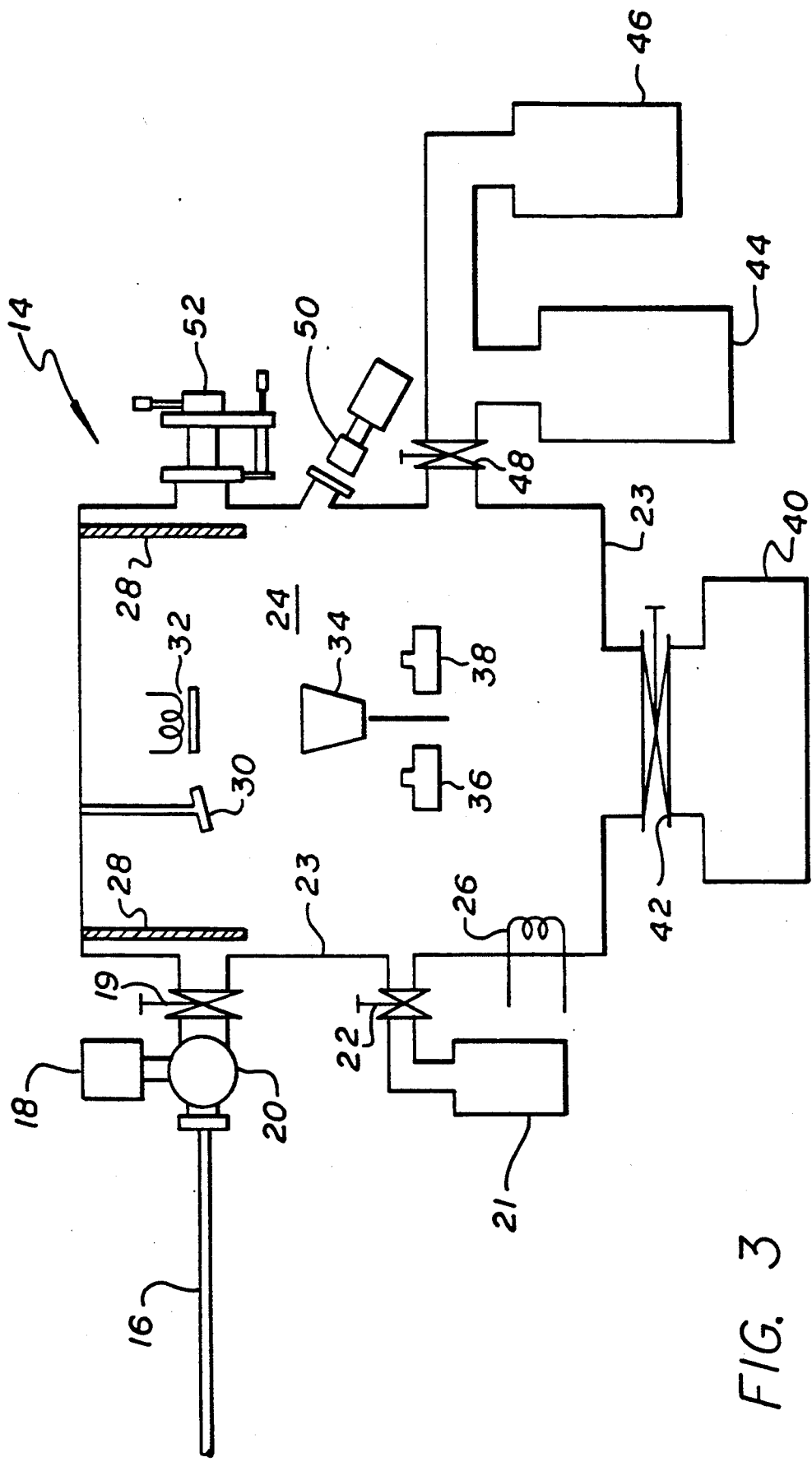
FIG. 3 is a schematic diagram of the organic molecular beam deposition system that is used to practice the present invention.

FIGS. 1 and 2 present the molecular structural formulae for the two organic crystalline semiconductors utilized in the preferred embodiment of the invention: 3,4,9,10-perylenetetracarboxylic dianhydride (PTCDA) and 3,4,7,8-naphthalenetetracarboxylic dianhydride (NTCDA). While the inventors have identified PTCDA and NTCDA as excellent specific choices for the fabrication of the integrated circuit devices described below, any two planar crystalline organic aromatic semiconductor materials may be used to practice the present invention. While both materials used in the invention are planar crystalline organic aromatic semiconductors, they differ from each other in that they have distinct chemical compositions. The alternating layers within integrated circuit devices made from these two materials must also be ordered with respect to each other.

By "ordered" is meant that the crystal structures of the two successively deposited layers are oriented in a regular fashion with respect to each other. The orientation is stable over a wide range of temperatures and for indefinite periods of time, and is a property of the two materials forming the multilayer stack. Since there is no exact lattice or structural matching of the two crystals, this regular ordering is termed herein "quasi-epitaxial".

The organic molecules useful in the practice of the invention are those which largely comprise planar stacking molecules and form crystalline phases. These molecules form regular crystalline stacks held together by van der Waals forces; they are not chemically bonded together. Such molecules are stable in ambient atmosphere and at temperatures ranging from low temperatures used in deposition on substrates up to at least 100° C.

Specific examples of such molecules are given above. Classes of additional examples include all polyacenes and porphyrins. Polyacenes comprise two or more fused benzene rings or fused benzene-heterocyclic rings. Preferred porphyrins are the phthalocyanines.

Functional groups may be present on the fused rings; examples include imides, anhydrides, and benzene rings.

Most of the molecules used in the practice of the invention are hole-conducting; such conductivity depends on the overlap of orbitals of the molecules in the stack.

Tight-binding calculations can predict to about 60% accuracy whether a given molecule will be n-type or p-type. Measurements made by forming Schottky diodes and determining the majority carrier provide a good indication of the majority carrier type; such a procedure is given in S. R. Forrest et al, Journal of Applied Physics, Vol. 55, No. 6, pp. 1492–1507 (Mar. 15, 1984).

The closer the molecules are spaced in the stack (the smaller the interplanar spacing), the better the conductivity. For example, PTCDA has an interplanar spacing of 3.21 Å, and the conductivity is quite good, compared with NTCDA, which has an interplanar spacing of 3.5 Å. For example, the resistivity of PTCDA along the stack is found to be $\approx 10$ k$\Omega$-cm when deposited by organic molecular beam deposition. NTCDA has a resistivity roughly 100 times larger.

The mobility of the carriers is a function of the closeness of stacking and the regularity of stacking. The process of the invention achieves regularity of stacking, permitting growth of layers up to about 1 $\mu$m thick, with substantially perfect order.

Charge carrier mobility is adversely affected by stacking faults, crystalline dislocations and imperfections such as impurities,, by increased layer spacing, and by higher temperatures.

The stacking habit is also critical to the practice of the invention. Columnar is a preferred configuration, while herringbone, often seen with NTCDA, for example, is not. By columnar is meant that the molecules in a stack are placed nearly directly above each other, with the planes of two adjacent molecules nearly parallel. By herringbone is meant that the planes of adjacent molecules are stacked approximately in a nested "V" formation. The stacking habit of a molecule is dependant on composition and conditions used in deposition, and is readily determined.

FIG. 3 is a schematic diagram of the organic molecular beam deposition system 14 that is used to practice the present invention. A turbo pump 18 is used to pump a loadlock chamber 20. A specimen transfer rod 16 is utilized to move the specimen from the load-lock chamber 20 through a gate valve 19 into the interior 24 of a growth chamber 23. Initial pumpdown of the growth chamber 23 is achieved by a sorption pump 21 through a valve 22. A cryopump 40, an ion pump 44, and a Ti sublimation pump 46 are then used to pump down the growth chamber 23 to the ultra-high vacuum regime ($\approx 10^{-9}$ to $10^{-10}$ Torr). A liquid nitrogen shroud 28 is used to achieve an even better vacuum level. Crystalline organic thin films are grown by sequentially heating sources 36 and 38 at temperatures high enough to induce sublimation of the constituent molecules, but not so high as to cause molecular decomposition. Typically, source temperatures range from about 200° to 600° C., depending on the material being deposited.

In one of the embodiments of the invention, the sources contain PTCDA 36 and NTCDA 38. The thickness of the films deposited on the substrate 32 and the deposition rate are measured by a crystal thickness monitor 30. The substrate 32 is held at 90K during the deposition process. A collimator 34 is employed to collimate the organic molecular beams. A residual gas analyzer (RGA) 26 is used to analyze the chemical species in the growth chamber. The deposition process is monitored by a video camera 50. Items within the chamber 23 can be handled with a manipulator 52.

Organic Multiple Quantum Well Light Modulators

The formulation of multiple quantum wells employing alternating layers of PTCDA and NTCDA is known in the art; see, e.g., F. F. So et al, "Quasi-epitaxial growth of organic multiple quantum well structures by organic molecular beam deposition", *Applied Physics Letters*, Vol. 56, No. 7, pp. 674-676 (Feb. 12, 1990). The following description is directed to a specific device configuration employing the multiple quantum well structure.

FIG. 4A is a schematic view of an organic multiple quantum well (MQW) light modulator 54. In the preferred embodiment of the invention, alternating layers of thickness in the range of about 10 to 500 Å of PTCDA 60 and NTCDA 62 are deposited on a substrate 56 coated with a thin gold film (not shown). Another thin gold film is used as the cap contact layer 66.

It should be noted, however, that the top and bottom contacts need not be gold. Their main purpose is to prevent current from flowing through the multilayer stack, and hence any current-blocking contact (such as Al on PTCDA) will serve this purpose. Additionally, the multilayer stack can be coated with a thin (typically about 100 to 1,000 Å) insulator such as $SiN_x$ or $SiO_2$ which is deposited using sputtering, plasma-enhanced chemical vapor deposition (PECVD), or other equivalent process. The metal contacts are then deposited on top of the insulating film, thus forming a strongly current-blocking contact.

As an electric field is applied across the organic quantum wells 58 using the ground lead 68 and the voltage lead 70, the optical absorption edge is shifted due to the combined effects of polarization of the organic molecules, as well as due to Stark shifting of the molecular exciton lines. If the wavelength of the incident light beam is at an energy slightly lower than the optical absorption edge energy of the so-called 0—0 exciton characteristic of the organic layers used in the modulator at zero applied electric field, then the light is absorbed and the modulator is in the "on" state. Applying an electric field shifts the absorption edge to an energy lower than that of the incident light, thus turning the modulator from a transparent to an absorbing (or "off") state. This process can be done in times of <10 ns, thus efficiently modulating the incident light beam at high bandwidths.

One clear advantage of using organic thin film multilayer stacks 58 for such an application is that the composition of the organic materials comprising the stacks can be varied over a broad range to be applied to a similarly broad range of wavelengths. That is, pairs of materials whose zero field absorption edges cover the visible and near-infrared spectral regions are commercially available. Since the structures can be grown in ordered stacks by the process of quasi-epitaxy discussed above, one is not limited in the choice of materials combinations forming the stacks to those whose lattice constants are equal, as is the case with conventional semiconductor multilayer structures. Thus, while PTCDA/NTCDA is one possible combination of materials, it will be appreciated by those skilled in the art that the invention is not limited to this particular combination. Indeed, any pair of polyacenes, or polyacenes used in combination with phthalocyanines, or any of the above materials used in combination with planar stacking organic molecules bonded by van der Waals forces can be used in such structures when the materials are deposited by a means resulting in quasi-epitaxial growth.

Figure 4B:
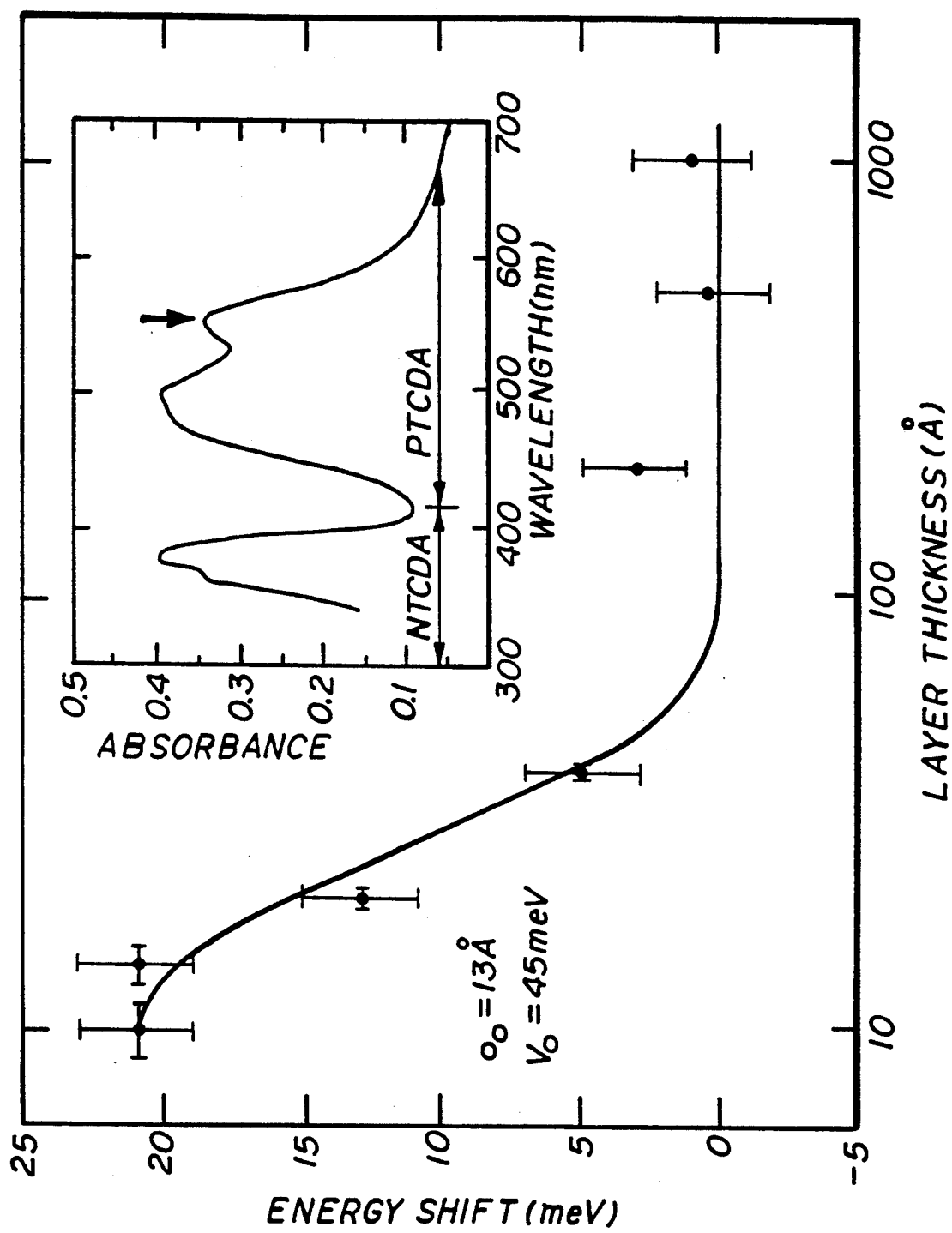
FIG. 4B is a plot of the optical absorption spectrum of a PTCDA/NTCDA multiple quantum well structure.

A typical optical absorption spectrum 72 of a PTCDA/-NTCDA organic multiple quantum well sample at room temperature is shown in FIG. 4B. From the low-energy cutoffs of the absorption spectra, the "energy gaps" were determined to be 2.2 and 3.1 eV, for PTCDA and NTCDAL respectively. This device would be useful for modulating light of energy approximately equal to 2.2 eV.

Organic Multiple Quantum Well Photodetectors

Figure 5:
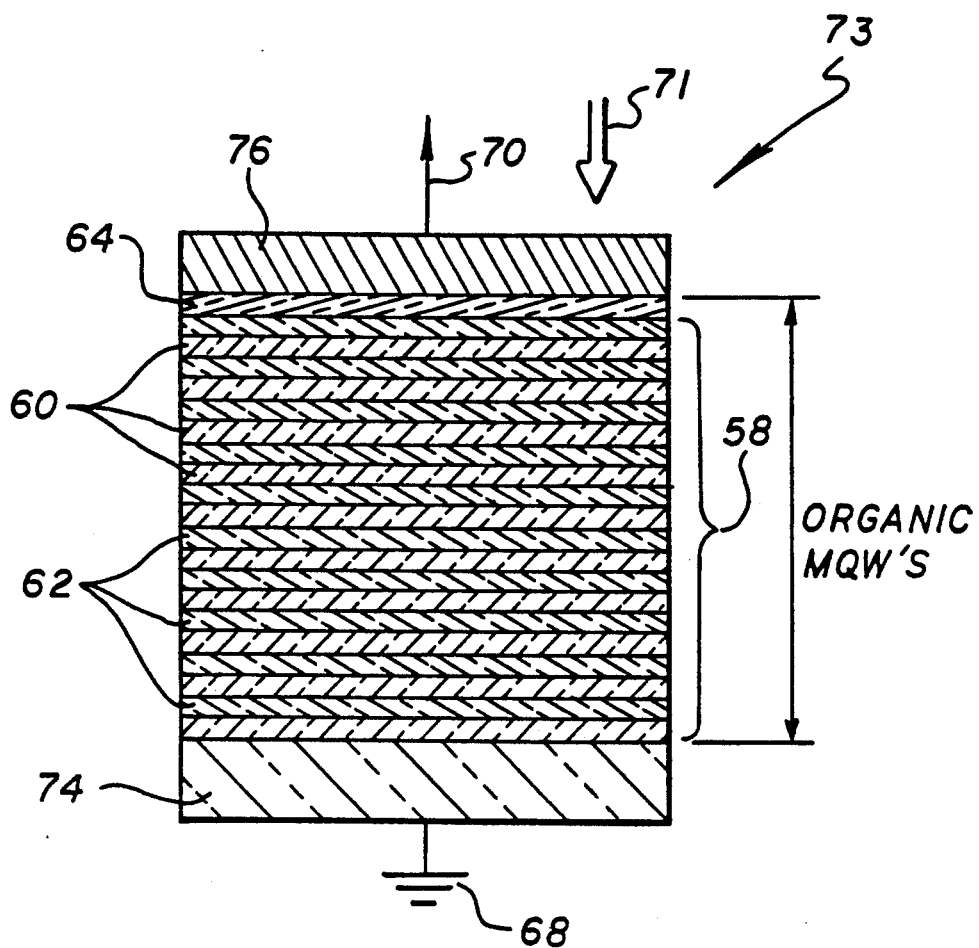
FIG. 5 is a schematic view of an organic multiple quantum well photodetector.

FIG. 5 is a schematic view of an organic multiple quantum well photodetector 73 that is similar to the modulator 54 depicted in FIG. 4A. In the case of the photodetector 73, either one or both of the contacts are low resistance (ohmic), electrically non-blocking contacts with the organic semiconductor. When both of the contacts are ohmic, the device is a photoconductor, and when only one of the contacts is ohmic, the device is a Schottky barrier detector operating under reverse bias. One or both of the contacts should be transparent. In one embodiment of the device, transparent indium tin oxide (ITO) contacts form ohmic contacts 76 with PTCDA. The current blocking layer 74 is formed from a material such as aluminum or gold. Here, layers of PTCDA/NTCDA, or any materials pair used in the modulator structure, are deposited in an alternating fashion to a thickness in the range of about 10 to 500 Å.

This device has advantages over single or double layer organic semiconductor photodetectors in that its quantum efficiency for light absorption can be greatly improved. Here, quantum efficiency is enhanced by placing an interface (e.g., a PTCDA/NTCDA heterojunction) within a diffusion length of a photogenerated exciton. Thus, the exciton can diffuse to such an interface prior to radiatively recombining. Since this interface is placed in a region of the diode with a non-zero electric field applied from the contacts, the dissociation of the exciton at the interface leads to the generation of a free electron and hole which are then swept apart by this field. This electron-hole pair is then detected as photocurrent in the external circuit. The key to high efficiency operation of the device is due to the placement of the interface where exciton dissociation occurs within a characteristic diffusion length of the exciton. Highest efficiency is achieved where one of the materials strongly absorbs the incident light, while the other material comprising the multilayer stack is transparent. For example, in a PTCDA/NTCDA MQW photodetector, light of energy between 2.2 and 3.1 eV is most efficiently absorbed in the PTCDA, whereas NTCDA is transparent to these wavelengths. The cumulative thickness of the absorbing layers must be at least equal to $1/\alpha$, where $\alpha$ is the optical absorption length of the layers. Typically, in the energy range from 2.2 to 3.1 eV, $\alpha \approx 10^5$ cm$^{-1}$ for PTCDA, which means that the sum of the thicknesses of all PTCDA layers should exceed 1,000 Å further constraint on the design is that the total absorbing layer plus transparent layer thicknesses must all reside in a region of the device where the electric field is non-zero.

Growth of Organic Crystalline Layers

The inventors have fabricated integrated circuit devices by organic molecular beam deposition at a base pressure in the mid-$10^{-10}$ Torr range. Purified sources of PTCDA and NTCDA were loaded into two organic sublimation cells 36 and 38 with exit ports directed towards the substrate 32.

The growth of the organic crystalline layers is preferably done at a pressure of less than about $10^{-6}$ Torr and most preferably at a pressure of less than about $5 \times 10^{-8}$ Torr.

The growth is achieved by sequentially heating the sublimation cells (450° C. for PTCDA and 250° C. for NTCDA) to achieve a growth rate of approximately 1 to 3 Å/sec; and in any event less than about 5 Å/sec. Growth rates exceeding about 5 Å/sec result in the formation of amorphous or polycrystalline films and thus are to be avoided. The extent of heating the sublimation cells controls the growth rate. That is, higher deposition rates are achieved by increasing the source cell temperature. Temperatures must be kept below the molecular decomposition temperature, which is generally about 100° to 300° C. higher than the sublimation temperature. In any case, it is rate and not temperature which is controlled during deposition. Rates of <5 Å require source temperatures well below the thermal decomposition temperature.

The substrate is maintained at a temperature below about 150K (−125° C.). Good surface morphology and sharp interfaces between layers are attained at a substrate temperature below about 150K, while polycrystallinity of the film is avoided by maintaining the substrate temperature above about 70K. Preferably, the substrate is maintained in the range of about 70K (−205° C.) to 120K (−155° C.). It is understood that the optimum substrate temperature required to achieve single crystalline deposition of crystalline orlo ganic semiconductors other than PTCDA and NTCDA may lie outside the range of 70 to 120K. However, the optimum temperature range for a given organic compound is easily found using conventional analysis methods such as film birefringence or X-ray analysis, which reveal the crystalline texture of the deposited films.

As an example, PTCDA layers were grown at a pressure of approximately $10^{-8}$ Torr, with the substrate temperature maintained below 120K. The layer thickness in this typical embodiment was varied from 10 to 200 Å, and the number of periods was varied from four to twenty. Single crystalline films consisting of as few as one period are easily obtained using these deposition conditions.

The growth rate for these layers was measured using a conventional crystal thickness monitor. Good surface morphology and sharp interfaces were achieved by growing organic thin films at substrate temperatures below 150K and preferably below 120K. For comparison, films were also grown at a substrate temperature of 440K (160° C.). At such a substrate temperature, 0.2 μm diameter grains were typically observed. On the other hand, a very smooth surface was obtained for films deposited at a substrate temperature of 90K (−185° C.). A similar temperature dependence of the surface morphology of NTCDA films has been found. For this reason, the substrate temperature during growth was kept at 90K. In the preferred embodiment of the invention, the maximum deposition rate utilized is about 5 Å per second and the thickest layer deposited is about 1 μm. The preferred method employed a source to substrate distance of about 10 to 35 cm and a pressure not greater than $10^{-6}$ Torr. After deposition, the deposited products were allowed to heat slowly back up to room temperature over a period of three to four hours. It is important to allow the film to warm up over this period of time to avoid cracking which occurs when the film is rapidly warmed.

Organic Bipolar Transistor/Phototransistors

Figure 6:
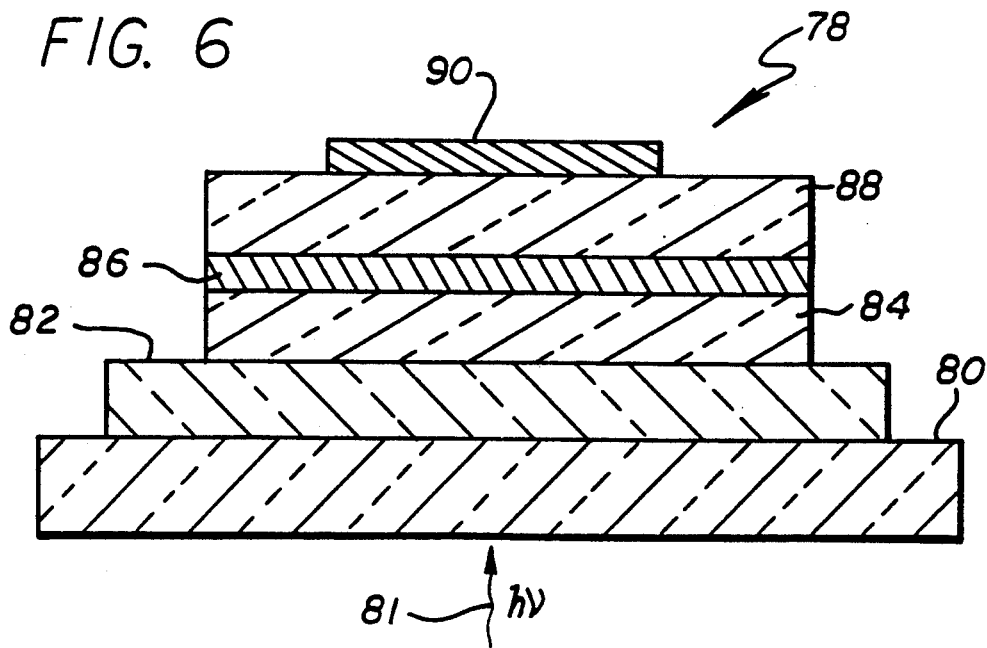
FIG. 6 is a schematic illustration of an organic bipolar transistor/phototransistor.
Figure 7:
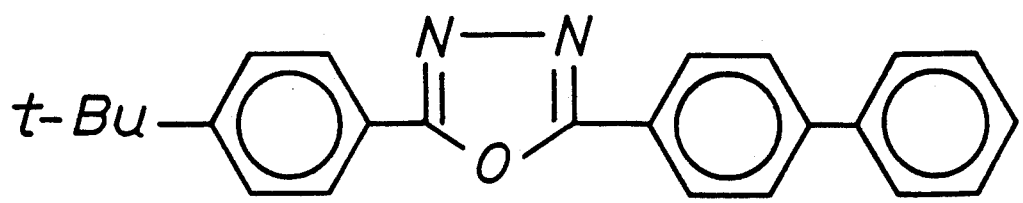
FIG. 7 represents the molecular structure of oxadiazole derivative (PBD)
Figure 8:
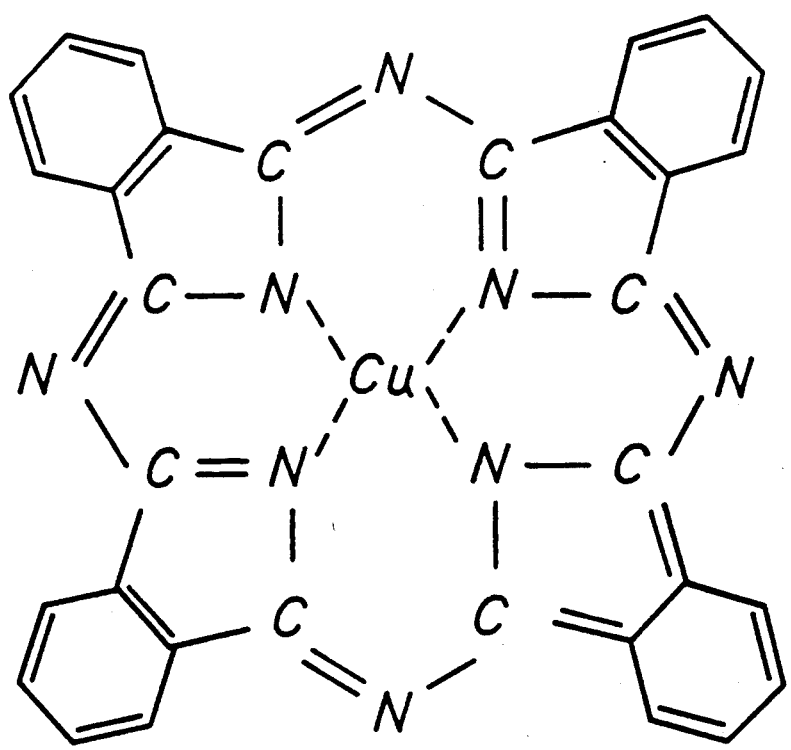
FIG. 8 presents the molecular structural formula for copper phthalocyanine (CuPc)
Figure 9:
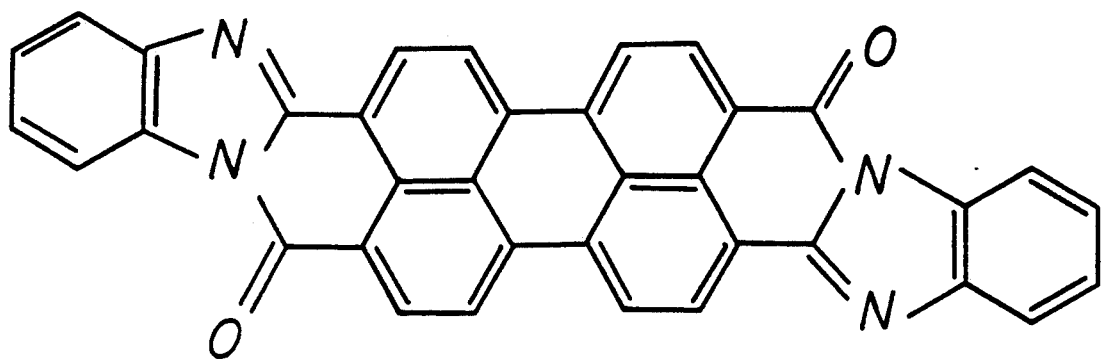
FIG. 9 presents the molecular structural formula for 3,4,9,10-perylenetetracarboxy-bis-benzimidazole (PTCBI or PB)

FIG. 6 is a schematic illustration of an organic bipolar transistor/phototransistor 78. This device employs two stable, crystalline, aromatic dye compounds. one of the two compounds conducts holes, the other conducts electrons. In the preferred embodiment of the invention, the compound which transports electrons is oxadiazole derivative (PBD), the structure of which is shown in FIG. 7. The compound selected to transport holes is copper phthalocyanine (CuPc) or PTCDA or NTCDA or 3,4,9,10-perylenetetracarboxylic-bis-benzimidazole (PB) or other porphyrin, polyacens, or derivative thereof, as described above. FIGS. 8 and 9 provide illustrations of the molecular structural formulae for PB and CuPc.

The multilayer structure 78 shown in FIG. 6 is deposited in thin-film form and includes a glass substrate 80 covered by a transparent conducting back contact 82. Photons 81 enter the transistor 78 through the transparent substrate 80. The contact 82 is composed of a thin transparent conductor such as indium tin oxide (ITO). A sandwich of three layers which function as a collector 84, a base 86, and an emitter 88 is deposited on top of back contact 82. In the preferred embodiment, the collector 84 and the emitter 88 comprise PTCDA, although the collector layer 84 may also comprise an inorganic semiconductor. The base 86 comprises PB. Alternatively, the base layer 86 can be formed from an n-type material, such as PBD. The base layer 86 is generally from about 1,000 to 2,000 Å thick, but may be as thin as 10 Å. The emitter 88 and collector 84 layers are each generally about 1,000 to 4,000 Å in thickness. A top contact 90 is deposited over the emitter 88. This contact 90 can be made from any ohmic metal such as indium, tin, titanium, or other similar material. A three-terminal device can also be made by contacting the base layer 86, so long as the in-plane resistivity of the base layer 86 is not too high.

The transistor/phototransistor 78 relies on the creation of excitons in either the base 86 or the collector 84 layers. The excitons drift into the organic/inorganic interface, dissociate, and the resulting electron and hole are then swept across the base 86 into the emitter 88 and collector 84, respectively. Gain is obtained by modulating the space charge current between the emitter 88 and collector 84 via injection from the contacts. The base potential barrier is modulated by the presence of photogenerated charge. It should be noted that the collector or base can be formed using thin multilayer stacks as in the case of the MQW photodetector. This will increase the efficiency of the phototransistor in a similar fashion to that in the multiple quantum well photodetector.

Unlike inorganic materials, the organic transistor 78 can be fabricated on any planar substrate, and therefore the layers do not need to lattice-matched either to the substrate or to each other. The composition of the organic materials that are employed can be tailored to absorb in different spectral regions, which enables the designer to construct high-ef f iciency phototransistors with appreciable gain which cover a large spectral region. This organic transistor invention 78 is also potentially useful in a wide variety of applications, including low-cost circuits and display panels.

Figure 10:
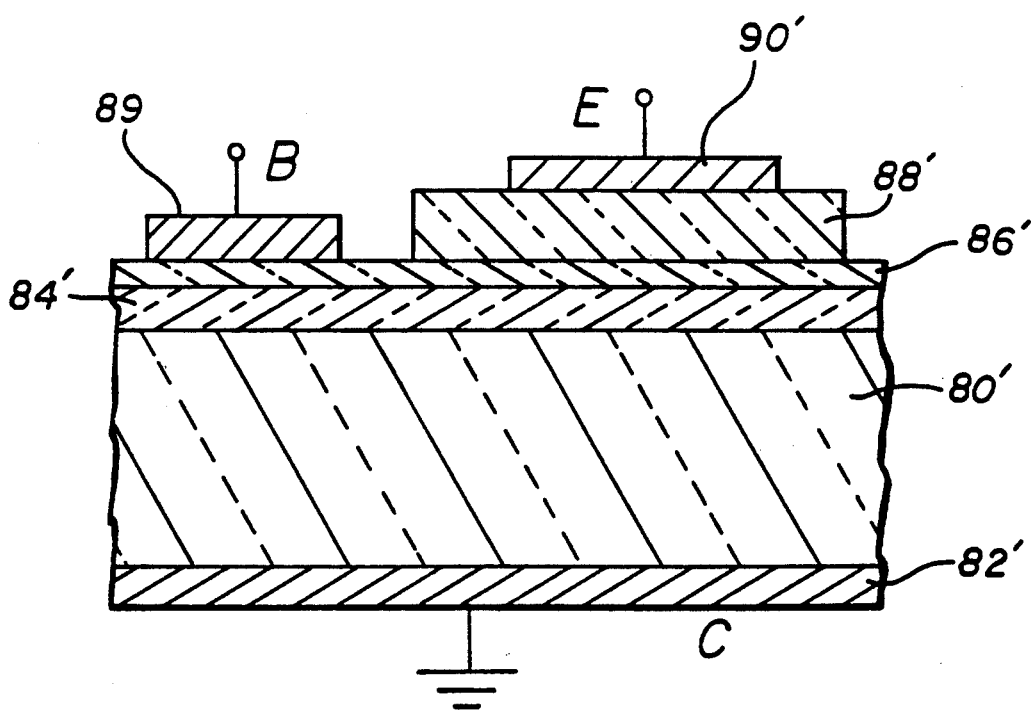
FIG. 10 is a cross-sectional view of an alternative embodiment of a bipolar transistor of the invention, incorporating an inorganic base and collector on an inorganic substrate, and an organic emitter.

In a variation on the fully organic transistor structure, one could alternatively grow the collector and base layers using an inorganic semiconductor as shown in FIG. 10. Here, a semiconductor such as indium phosphide, gallium arsenide or silicon are typical examples. In a typical embodiment of the invention, the collector 84' is n-type and the base 86' is p-type semiconductor. The base is typically about 500 to 5,000 Å thick, while the collector, which is formed on a semiconductor substrate 80', is about 2 $\mu$m thick.

Next, a thin (about 10 to 2,000 Å) layer of organic material, such as PTCDA, is deposited on the base layer 86' to form the wide band-gap emitter layer 88'. Finally, ohmic contacts 82', 89, and 90' to collector, base, and emitter, respectively, are made using techniques well-known to those skilled in the art.

Such a transistor utilizes the very wide band-gap of the organic semiconductor to greatly enhance the current gain of the device, and to decrease the capacitance of the base-emitter junction by virtue of the low free carrier concentration characteristic of crystalline organic semiconductors. That is, this organic/inorganic transistor is similar in concept to fully inorganic wide band-gap emitter transistors, except that it has a considerably larger baseemitter energy band offset energy, leading to higher gains. The lower capacitance also leads to higher bandwidth operation. Due to the different chemistries of the organic and inorganic materials used in the structure, making contact to the very thin base layer is extremely simple, since the organic film comprising the emitter is easily and preferentially removed by immersion in an aqueous base solution which dissolves the organic but not the inorganic materials. Alternatively, etching the organic in a reactive ion beam environment such as $CF_4:O_2$ is easily accomplished.

INDUSTRIAL APPLICABILITY

The present invention is expected to find use in a wide variety of optoelectronic device applications, utilizing organic semiconductor thin films.

Although the present invention has been described in detail with reference to a particular preferred embodiment, persons possessing ordinary skill in the art to which this invention pertains will appreciate that various modifications and enhancements may be made without departing from the spirit and scope of the claims that follow.

What is claimed is:

1. An optoelectronic device formed by a process comprising the steps of:
    (a) providing a chamber (23) having an interior (24);
    (b) placing a substrate (32) in said chamber (23);
    (c) maintaining said interior (24) of said chamber (23) at a pressure less than about $10^{-6}$ Torr;
    (d) placing a first source material (36) in said chamber (23), said first source material (36) being a planar crystalline organic aromatic semiconductor and selected from the group of organic compounds consisting of polyacenes and porphyrins and derivatives thereof;
    (e) placing a second source material (38) in said chamber (23), said second source material (38) being a planar crystalline organic aromatic semiconductor, said second source material (38) having a generally different chemical composition from said first source material (36) and selected from the group of organic compounds consisting of polyacenes and porphyrins and derivatives thereof;
    (f) depositing a layer of said first source material (36) on top of said substrate (32) by heating said first source material (36);
    (g) depositing a layer of said second source material (38) on top of siad first source material (38) by heating said second source material (38); and
    (h) maintaining said substrate (32) at a temperature during deposition sufficient to provide good morphology, shart interfaces between layers, and single crystalline layers of said first and second materials.

2. A quasi-epitaxial optoelectronic device comprising:
    (a) a substrate (32);
    (b) a first layer (60) deposited on top of said substrate (32), said first layer (60) comprising a planar crystalline organic aromatic semiconductor and selected from the group of organic compounds consisting of polyacenes and porphyrins and derivatives thereof; and
    (c) a second layer (62) deposited on top of said first layer (60), said second layer (62) comprising a planar crystalline organic aromatic semiconductor, said second layer (62) having a generally different chemical composition than said first layer (60) and selected from the group of organic compounds consisting of polyacenes and prophyrins and derivatives thereof, said first (60) and second (62) layers having crystal structures in an ordered relationship with respect to each other.

3. The device as recited in claim 2, in which said substrate (32) comprises a material selected from the group consisting of glass and an inorganic semiconductor.

4. The device as recited in claim 3, in which said substrate (32) comprises an inorganic semiconductor selected from the group consisting of silicon, gallium arsenide, indium phosphide, and cadmium telluride.

5. The device as recited in claim 2, in which said first and second layers are independently selected from the group consisting of 3,4,9,10-perylenetetracarboxylic dianhydride, 3,4,7,8-naphthalenetetracarboxylic dianhydride, copper phthalocyanine, 3,4,9,10-perylenetetracarboxylic-bis-benzimidazole, and oxadiazole derivative.

6. The device as recited in claim 5, in which said first layer (60) comprises 3,4,9,10-perylenetetracarboxylic dianhydride and in which said second layer (62) comprises 3,4,7,8-naphthalenetetracarboxylic dianhydride.

7. An organic multiple quantum well light modulator (54) comrpising:
    (a) a substrate layer (56);
    (b) a plurality of alternating layers (58) of a first (60) and a second (62) planar crystalline organic aromatic semiconductor material, said second (62) planar crystalline organic aromatic semiconductor material having a generally different chemical composition than said first (60) planar crystalline organic aromatic semiconductor material, said first and second planar organic semiconductor materials selected from the group of organic compounds consisting of polyacenes and porphyrins and derivatives thereof;

(c) said plurality of alternating layers (58) of said first (60) and said second (62) planar crystalline organic aromatic semiconductor materials located on top of said substrate layer (56);

(d) an additional layer (64) of said first (60) planar crystalline organic aromatic semiconductor material located on top of said plurality of alternating layers (58);

(e) a cap layer (66) disposed to collect photons (71);

(f) a ground lead (68) connected to said substrate layer (56); and (g) a voltage lead (70) connected to said cap layer (66).

8. The modulator as recited in claim 7, in which said substrate layer (56) comprises a conductor.

9. The modulator as recited in claim 8, in which said substrate layer (56) comprises gold.

10. The modulator as recited in claim 7, in which said substrate layer (56) comprises an insulator.

11. The modulator as recited in claim 7, in which said cap layer (66) comprises a conductor.

12. The modulator as recited in claim 11, in which said cap layer (66) comprises gold.

13. The modulator as recited in claim 7, in which said cap layer (66) comprises an insulator.

14. The modulator as recited in claim 7, in which said first and second layers are independently selected from the group consisting of 3,4,9,10-perylenetetracarboxylic dianhydride, 3,4,7,8-naphthalenetetracarboxylic dianhydride, copper phthalocyanine, 3,4,9,10-perylenetetracarboxylic-bis-benzimidazole, and oxadiazole derivative.

15. The modulator as recited in claim 14, in which said first layer (60) comprises 3,4,9,10-perylenetetracarboxylic dianhydride and in which said second layer (62) comprises 3,4,7,8-naphthalenetetracarboxylic dianhydride.

16. An organic multiple quantum well photodetector (73) comprising:

(a) a substrate layer (74);

(b) a plurality of alternating layers (58) of a first (60) and a second (62) planar crystalline organic aromatic semiconductor material, said second (62) planar organic aromatic semiconductor material having a generally different chemical composition than said first (60) planar organic aromatic semiconductor material, said plurality of alternating layers (58) of said first (60) and said second (62) organic aromatic semiconductor materials located on top of said substrate layer (74), said first and second planar organic semiconductor materials selected from the group of organic compounds consisting of polyacenes and porphyrins and derivatives thereof;

(c) an additional layer (64) of said first (60) planar organic aromatic semiconductor material located on top of said plurality of alternating layers (58);

(d) a cap layer (78) disposed to collect photons (71); said cap layer (78) being formed from a tin indium oxide (ITO) material;

(e) a ground lead (68) connected to said substrate layer (74); and (f) a voltage lead (70) connected to said cap layer (78).

17. The photodetector as recited in claim 16, in which said substrate layer (74) comprises a conductor.

18. The photodetector as recited in claim 17, in which said substrate layer (74) comprises gold.

19. The photodetector as recited in claim 16, in which said substrate layer (74) comprises an insulator.

20. The photodetector as recited in claim 16, in which said first and second layers are independently selected from the group consisting of 3,4,9,10-perylenetetracarboxylic dianhydride, 3,4,7,8-naphthalenetetracarboxylic dianhydride, copper phthalocyanine, 3,4,9,10-perylenetetracarboxylic-bis-benzimidazole, and oxadiazole derivative.

21. The photodetector as recited in claim 20, in which said first layer (60) comprises 3,4,9,10-perylenetetracarboxylic dianhydride and in which said second layer (62) comprises 3,4,7,8-naphthalenetetracarboxylic dianhydride.

22. A bipolar transistor formed on a substrate (80, 80') and comprising three layers (84, 86, 88, 84', 86', 88') of semiconductor material, at least one of which layers comprises a planar crystalline organic aromatic semiconductor material selected from the group of organic compounds consisting of polyacenes and porphyrins and derivatives thereof, with appropriate contacts (82, 90, 82', 89, 90') made to at least two layers thereof.

23. The transistor as recited in claim 22, in which said substrate comprises a material selected from the group consisting of glass and inorganic semiconductors.

24. The transistor as recited in claim 23 in which said substrate comprises an inorganic semiconductor material selected from the group consisting of silicon, gallium arsenide, indium phosphide, and cadmium telluride.

25. The transistor as recited in claim 22, in which said planar crystalline organic semiconductor material is selected from the group consisting of 3,4,9,10-perylenetetracarboxylic dianhydride, 3,4,7,8-naphthalenetetracarboxylic dianhydride, copper phthalocyanine, 3,4,9,10-perylenetetracarboxylic-bis-benzimidazole, and oxadiazole derivative.

26. The transistor (78) of claim 22 comprising three organic semiconductor layers, with an inner layer (86) comprising a first planar crystalline organic aromatic semiconductor, said one layer sandwiched between two outer layers (84, 88) each comprising a second planar crystalline organic aromatic semiconductor, one of which organic semiconductors conducts holes and the other of which organic semiconductors conducts electrons, said first and second planar organic semiconductor materials selected from the group of organic compounds consisting of polyacenes and porphyrins and derivatives thereof, with contacts (82, 90) formed to at least said two outer layers.

27. The transistor of claim 26 wherein said substrate comprises a transparent material, wherein one of said outer layers (84) is formed over said substrate, and wherein a transparent conductor (82) is interposed between said substrate and said one of said outer layers.

28. The transistor of claim 26 wherein said holeconducting semiconductor is selected from the group consisting of 3,4,9,10-perylenetetracarboxylic dianhydride, 3,4,7,8-naphthalenetetracarboxylic dianhydride, copper phthalocyanine, and 3,4,9,10-perylenetetracarboxylic-bis-benzimidazole.

29. The transistor of claim 26 wherein said electron-conducting semiconductor consists essentially of oxadiazole derivative.

30. The transistor of claim 22 comprising a collector layer (84') of a first conductivity type and a base layer (86') formed thereon of a second conductivity type, said collector and base layers consisting essentially of an inorganic semiconductor material and further comprising an emitter layer (88') formed on said base layer, said emitter layer consisting essentially of said first planar crystalline organic aromatic semiconductor, said first and second planar organic semiconductor materials selected from the group of organic compounds consisting of polyacenes and porphyrins and derivatives thereof, with separate contacts (82', 89, 90') formed to each semiconductor layer.

31. The transistor of claim 30 wherein said inorganic semiconductor materials comprising said base and collector layers are selected from the group consisting of indium phosphide, gallium arsenide, and silicon.

32. The transistor of claim 22 wherein said organic semiconductor material consists essentially of 3,4,9,10-perylenetetracarboxylic dianhydride.

33. The optoelectronic device prepared by the process of claim 1 wherein steps (f) and (g) are alternately repeated a sufficient number of times to provide a multiple quantum well structure.

34. The device as recited in claim 2 comprising a plurality of alternating layers (58) of said first layer (60) and said second layer (62), said plurality of alternating layers (58) of said first (60) and said second (62) organic aromatic semiconductor materials located on top of said substrate layer (32).

35. The transistor of claim 26 wherein said outer layers (84, 84', 88, 88') constitute an emitter (88, 88') and a collector (84, 84') and wherein said inner layer (86, 86') constitutes a base (86, 86') and further wherein at least one of said collector (84, 84') and said base (86, 86') comprises a plurality of alternating layers (58) of said first (60) and said second (62) planar crystalline organic aromatic semiconductor materials, said second (62) planar crystalline organic aromatic semiconductor material having a generally different chemical composition than said first (60) planar organic aromatic semiconductor material, said plurality of alternating layers (58) of said first (60) and said second (62) organic aromatic semiconductor materials located on top of said substrate layer (80, 80').

* * * * *